(12) United States Patent
Albertson et al.

(10) Patent No.: US 9,977,054 B2
(45) Date of Patent: May 22, 2018

(54) ETCHING FOR PROBE WIRE TIPS FOR MICROELECTRONIC DEVICE TEST

(71) Applicant: INTEL CORPORATION, Santa Clara, CA (US)

(72) Inventors: Todd P. Albertson, Warren, OR (US); David M. Craig, Hillsboro, OR (US); David Shia, Hillsboro, OR (US); Joseph D. Stanford, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 277 days.

(21) Appl. No.: 14/739,241

(22) Filed: Jun. 15, 2015

(65) Prior Publication Data
US 2016/0363613 A1    Dec. 15, 2016

(51) Int. Cl.
*G01R 1/073* (2006.01)
*G01R 1/067* (2006.01)

(52) U.S. Cl.
CPC ..... *G01R 1/07314* (2013.01); *G01R 1/06755* (2013.01)

(58) Field of Classification Search
CPC ............ G01R 1/07314; G01R 1/06755
USPC ......... 324/755.01–756.06, 500, 754.24, 425, 324/437, 754.01–754.03, 758.01, 690; 257/734, 778, 48, 666; 438/12–17
See application file for complete search history.

(56) References Cited

U.S. PATENT DOCUMENTS

2015/0002181 A1* 1/2015 Martin ............... G01R 3/00
324/756.03

OTHER PUBLICATIONS

Office Action for Korean Patent Application No. 2016-0058255, dated Feb. 1, 2018, 13 pages.

* cited by examiner

*Primary Examiner* — Melissa Koval
*Assistant Examiner* — Trung Nguyen
(74) *Attorney, Agent, or Firm* — Schwabe, Williamson & Wyatt, P.C.

(57) ABSTRACT

Etching for probe wire tip is described particularly well suited to microelectronic device test. In one example, wires of a probe head are covered with an encapsulation material, the wires being attached to a test probe head substrate, each of the wires having two ends, the first end being attached to the substrate and the second end being opposite the substrate, each wire having an outer coating around a core. The wires are etched to remove the outer coating at the second end of the wires. The encapsulation material is then removed.

21 Claims, 6 Drawing Sheets

ETCHING FOR PROBE WIRE TIPS FOR MICROELECTRONIC DEVICE TEST

FIELD

The present description relates to probe wires for microelectronic device test and, in particular, to finishing the tips of probe wires.

BACKGROUND

In the manufacture of microelectronic devices, such as processors, controllers, and memory, the desired structures are formed on a wafer. Individual dies are cut from the wafer and then sealed into a package. The package has an array of pins, pads, or lands that make contact with the rest of the device, typically through a printed circuit board to allow the die to be operated while within the package. Before packaging, either as part of a wafer or an individual die, each die is tested to determine whether it has been manufactured correctly and operates as intended.

To perform the tests, some wafers have lands or pads specifically designed into each die for test purposes. Pins or probes are applied to the lands or pads and signals are sent or received through the pins to test the dies. For a more complex die, more pins are used. Similarly for denser circuitry on the die, the pins are closer together. The distance between pads is called the pitch.

The test probes are attached to a substrate that holds each probe in the proper position with respect to each other probe so that when the test probes are pressed against the pads on the die, each probe will contact its respective pad. The probes are resilient and have a shaped tip so that when the probes are pressed against the die the pressure will stress and break through any oxide that has formed on the surface of the wafer die bumps in order ensure good electrical contact. The tips wear with each new contact and, as a result, each test probe has a limited number of die tests that it can perform, after which it must be replaced. The replacement cost of each test probe is therefore a factor in the cost of die manufacturing.

Test probes may be made out of composite wires. The cross section of such a composite wire has several layers of different metallic materials arranged coaxially around the wire's center. The metals perform different functions and not all of the metals are well-suited to be pressed against the pads. Some materials are formed of a high durability material. Other materials are selected for electrical properties rather than strength and may smear onto the pads under pressure, damaging the pad and the probe wire. As a result, the outer layers of the wires are removed before the probe wires are used. The probes wires, when attached to a probe card, are in a densely populated array with varying pitches.

BRIEF DESCRIPTION OF THE DRAWINGS

Embodiments are illustrated by way of example, and not by way of limitation, in the figures of the accompanying drawings in which like reference numerals refer to similar elements.

DETAILED DESCRIPTION

As described herein, unwanted materials are uniformly and selectively removed from the tips of wires across an entire, variable pitch, test probe card array. As the connection pads on a die continue to shrink in pitch, the described techniques and apparatus allow test probe cards to be built for pads with a 90 µm pitch and below at reasonable cost.

A composite test probe wire is formed of several different materials. The materials are typically in coaxial layers, however, other structures may also be used. Each test probe wire may have a core material and then several coatings of other materials. In some embodiments, the core is a durable conductive metal with a suitable spring constant such as tungsten. The tungsten core is then coated with high conductivity metals such as aluminum, silver, or gold, or their alloys. In use, the tungsten provides a firm reliable contact point for the test probe, while the softer higher conductivity materials do not. In some cases, the softer metals may smear onto the contacts on the die, damaging the contact.

There are methods to selectively etch away metals for a single isolated composite wire. However, these methods do not all work well with a densely populated array of wires especially when the pitch varies across the probe card. As described herein a selective etching method may be applied at the array or probe card level to efficiently etch the ends of many wires at the same time.

In one embodiment, first the parts of the wire throughout the test probe array that are not intended to be stripped are first masked off. This is done carefully to avoid damaging or bending the test probes of the array. After the masking a chemical etching procedure is applied to remove selected materials from the tips of the wires in the array.

A first process flow is described below. In this example, the operations may be summarized as:
1. Wire body encapsulation/tip capture;
2. Chemical etch.

Figure 1:
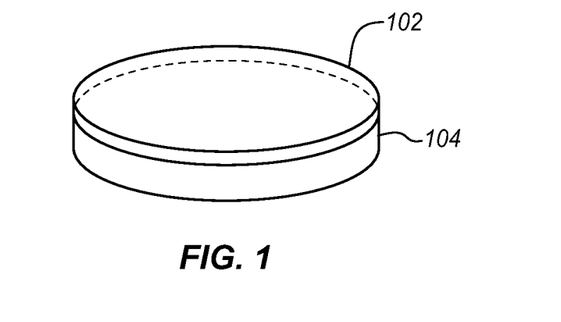
FIG. 1 is diagram of a platter with a thin layer of viscoelastic material according to an embodiment.

FIG. 1 is an isometric view of a thin layer of viscoelastic material 102 applied to a top side of a platter with a hard and flat surface 104. The viscoelastic material acts as a medium of capturing the tips of the wires in the array so that they do not become contaminated with the wire body encapsulation material. Any of a variety of different materials may be used including, as examples, Polydimethylsiloxane (PDMS) or Poly(methyl methacrylate) (PMMA). The platter is used to support the viscoelastic material in place. The platter may be formed of a glass, a ceramic, a metal, or any other rigid material that does not react with the viscoelastic material.

A non-stick coating, such as Teflon® or an oil is applied to the surface of the viscoelastic tip capture material. Then referring to FIG. 2, an isometric view of the platter and related components, a gasket or "well" 106 is placed on the top face of the viscoelastic material and over the platter. The walls of the gasket together with the top surface of the viscoelastic material define a container volume. This volume is filled with a liquid encapsulation material. The gasket may be formed of an elastomeric material or it may have a more rigid structure. In one embodiment, a thick O-ring is used. Depending on the nature of the viscoelastic material and the encapsulant, the gasket may form a flexible sealing surface or the viscoelastic material may form a flexible sealing surface or both.

Figure 2:
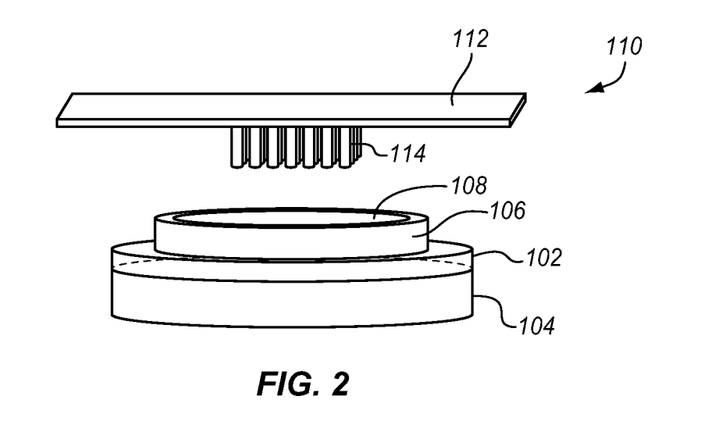
FIG. 2 is diagram of the platter of FIG. 1 with a well of encapsulation material and a probe card according to an embodiment.

As shown, the gasket is cylindrical with an annular surface that is open on the top and bottom so that the tip capture material forms the bottom of the well and the top of the well is open to receive the wire probes. However, the gasket may have any desired shape. For the illustrated probe array a rectangular gasket would more closely match the shape of the wire array. A matched rectangular array may require that less liquid be used to fill the well. Other well shapes may be selected to suit other purposes.

The encapsulation material may be selected so that it may be poured into the gasket as a liquid, and then later undergo a controlled phase change to a solid with minimal volumetric change. The encapsulation material is also selected to be resistant to any chemicals used in later chemical etching steps. The phase change may be caused by heating, cooling, a chemical reaction, applying ultraviolet light, or in any other means, depending on the particular materials being used. As examples, an acrylic solution with a catalyst may be used or heat or ultraviolet curing resin may be used. Possible encapsulation materials include as examples, paraffin waxes, UV (UltraViolet) adhesives, available from e.g., Dymax, Polysciences, or Hernon, poly(methyl methacrylate) (PMMA), etc.

Once the gasket is filled to the desired height with a liquid wire encapsulation material, an array of test probe wires 114 fastened to a test probe card is lowered into the pool of liquid 108 from above. The tips of the wires 114 travel through the wire encapsulation material 108 and embed their tips into the viscoelastic tip capture material 102 below the encapsulant. In some embodiments, viscoelastic material servers to wipe most of the encapsulant off the tips of the wires as they rub against it.

The test probe head 110 has a substrate 112 to which a large number of test wires are attached. The wires may be prepared before or after being attached to suit the intended application. In embodiments, each wire has a first end that is secured to the substrate and a second end that extends out away from the substrate. The tip at the second end is prepared by creating a sharp edge at the tip of the wire. This sharp edge may have one or more edges or points and is designed to be able to pierce through oxidation and other contaminants on the respective pad of the semiconductor device to make an electrical connection to the pad. The tip may be prepared before or after the wire is coated with other metals.

The wires are attached in a pattern to match the pads of the die or wafer that is to be tested. In the case of a wafer test, the test probe card may be as large as the wafer and have thousands of wires. Alternatively, the test probe card may be used to test only a part of the wafer at a time, for example one die or a few dies. The platter, the gasket and the other materials are sized to accommodate all of the probe wires at the same time. As a result, a single immersion into the encapsulant may be used to cover all of the wires.

Figure 3:
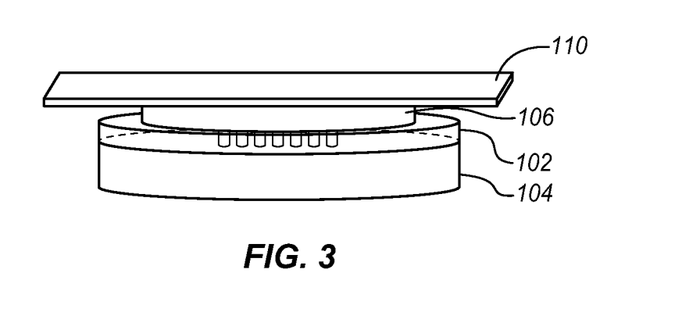
FIG. 3 is a diagram of the platter and well of FIG. 2 with the probe card immersed in the well according to an embodiment.

FIG. 3 is a side plan view of the test probe card placed over the encapsulant. The gasket 106 may be used to limit the depth of the probe wires into the encapsulant and to support the probe card substrate 112. The viscoelastic material receives the ends of the wires and therefore also limits how far the test probe wires can extend into the encapsulant. The ultimate etch depth of the wires is also determined by the thickness of the viscoelastic material placed on top of the hard and flat surface of the platter. The gasket is selected to have an inner diameter large enough to completely surround the array of wires so that all of the wires are immersed in one operation. The thickness or height of the gasket is a little less than the height of the wires so that the tips of the wires extend into the viscoelastic material below the gasket.

Some over travel of the wires into the viscoelastic material may be used to accommodate any difference in wire length across the array and to ensure that all the wire tips embed themselves sufficiently into the viscoelastic tip capture material. In other words, the tips of some of the wires may be allowed to extend further into the viscoelastic material than necessary to ensure that all of the wires extend far enough. This may be used to compensate for any differences in length between the wires.

The bodies of the wires, that is almost all of each wire except the tip, is completely submerged in the encapsulation liquid. The encapsulation material will form a protective layer to ensure that no wire material is removed from the encapsulated part of the wire during the rest of the process.

Figure 4:
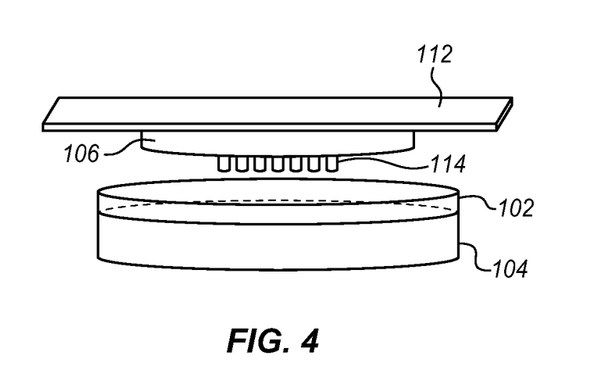
FIG. 4 is a diagram of the platter with the probe card and well lifted according to an embodiment.

After the wire tips are embedded in the viscoelastic tip capture material and the wire bodies are completely submerged in the liquid encapsulation material, a controlled phase change from liquid to solid is performed on the liquid encapsulation material. This may be done in a variety of different ways depending on the nature of the encapsulating material. It may be done by applying heat, cooling, ultraviolet light, a chemical catalyst, or simply waiting until after a reaction takes place, depending on the nature of the encapsulation material. During the phase change, the wire body encapsulation material is resting on top of the viscoelastic tip capture material. The various surfaces may be used to stabilize the position of the test card during this and other processes. In the example of FIG. 4, gravity is used to ensure a uniform and flat finished surface while the encapsulation material's liquid has executed its phase change.

After the phase change of the wire body encapsulation material has completed, the array is carefully removed from the viscoelastic tip capture material. The gasket is peeled away and the bodies of the wires in the array are uniformly captured in the now solid wire body encapsulation material. FIG. 4 is a side plan view of the probe card substrate 112 with the attached test wires 114. The viscoelastic material 102 remains on the platter 104. The encapsulation material is hardened and attached to the probe wire and the gasket 106 as the substrate 112 is lifted.

Figure 5:
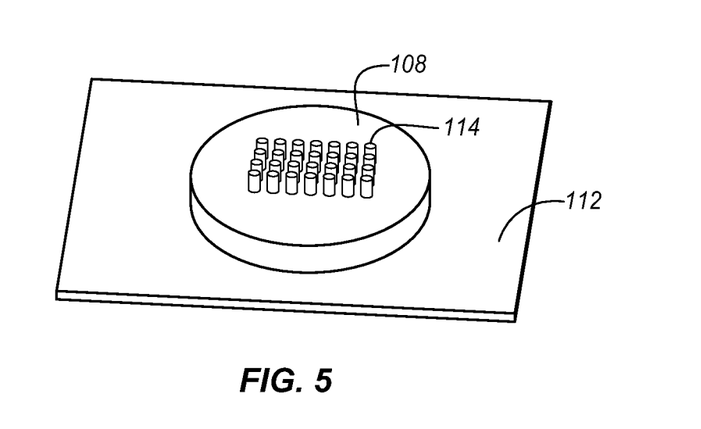
FIG. 5 is a diagram of the probe card of FIG. 4 inverted to show the encapsulation material according to an embodiment.

The tips of the wires are not covered in encapsulant. Most of the liquid encapsulation material 108 is extruded from the wire tips as the array is plunged into the viscoelastic tip capture material 102. FIG. 5 is an isometric view of the probe card substrate 112 with the wires covered in the hardened encapsulant 108. The tips of the wires extend through the encapsulant and are fully exposed. A plasma clean may be performed on the encapsulated wire array to eliminate any thin layers of encapsulation material that may remain on the wire tips.

As shown in FIG. 5, the main body of each probe wire is covered or masked by the solidified encapsulation material. The ends of the probe wires or wire tips are uniformly exposed to the desired depth. This depth is determined by the height of the gasket or by the depth of the viscoelastic material or both. A chemical etch may now be performed on the wire tips to remove any unwanted materials, such as coatings layers, or other components of the composite test probe wire.

Figure 6:
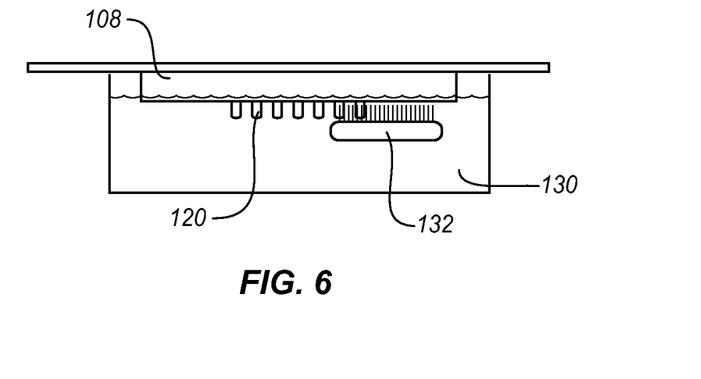
FIG. 6 is a diagram of cleaning the probe ends in a liquid bath according to an embodiment.

As shown in FIG. 6, the etching may be done by soaking the encapsulated wire array 114 in a chemical etch bath 130. The etch bath is filled with an etchant, such as a sulfuric or hydrochloric acid, that is selected to remove the outer layers of the composite wire from the ends 120 of the wires without affecting the desired core or inner layers and without affecting the encapsulant. In some embodiments, the wire tip may be agitated, for example with a brush 132 to eliminate any bubbles that may form during the reaction. The brushing may be applied to the etchant interface at the probe tips 120. This may also mechanically remove material that is etched by the etchant chemicals.

Figure 7:
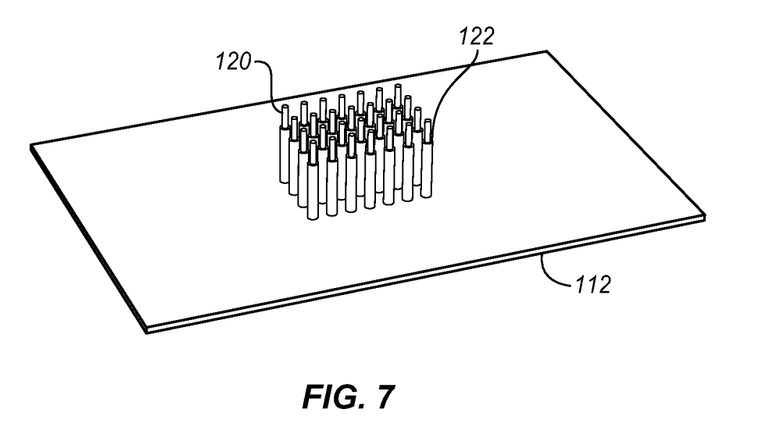
FIG. 7 is a diagram of the probe card after removing the encapsulation material according to an embodiment.

After the wire tips are treated by the etchant, the probe card still looks very much like it does in FIG. 5, however, the probe test wires are different because some of the outer materials of the wires have been removed. Once the wire body encapsulation material is removed from the array, the array of wires remains with the tips etched to a uniform depth as shown in FIG. 7. The probe wires 114 are still attached to the substrate 112 of the probe test card. The main bodies of the wires are the same as they were before the treatment. The outer layers 122 of the composite wire are still visible. The prepared tips 120, however, are exposed.

Figure 8:
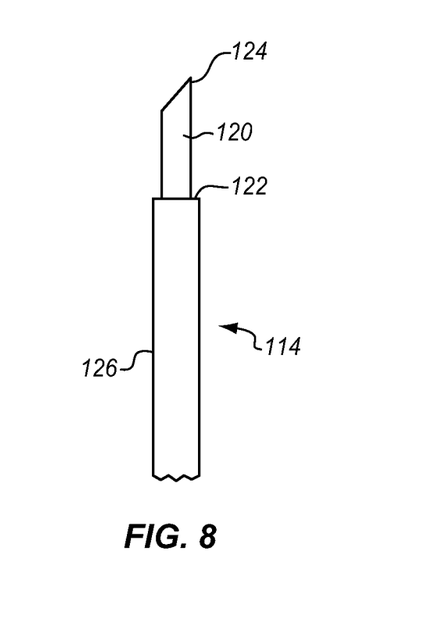
FIG. 8 is a side view of a single probe wire of FIG. 7 according to an embodiment.

FIG. 8 shows an example of one of the wires of the array 114 in more detail. Here there is a lower main body 126 with multiple layers of material to form the composite wire. At the end of the wire, 120, the outer layers 122 are removed to expose the central core material. This material is prepared with a sharp tip 124. In this example, the tip has a bevel on one side to form a sharp edge. However, the tip may take many different shapes, depending on the particular implementation.

In another embodiment, the wires are fully covered by the encapsulant and instead of relying on the height of the gasket to determine how much of each wire is exposed, the ends of the wires are first completely or almost completely encapsulated and then exposed by etching. This is similar to the process described above with the omission of the viscoelastic tip capture material and the addition of a plasma etch. This second process may be summarized as follows:

1. Wire encapsulation;
2. Plasma etch of encapsulation material;
3. Chemical etch of wire tips.

Figure 9:
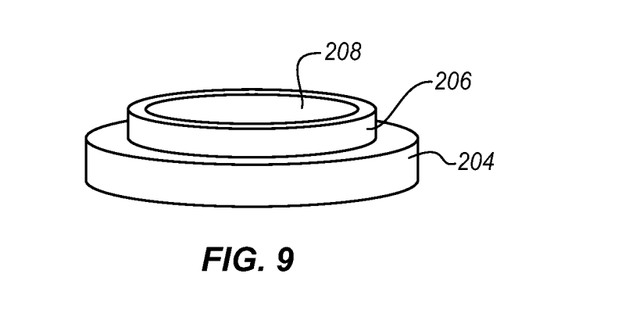
FIG. 9 is an alternative diagram of a platter and a well according to an embodiment.

FIG. 9 is an isometric view of a first processing stage for the probe card. A well 206 formed, for example, by a gasket similar to that of FIG. 1 is placed on a flat, hard surface 204 similar to the platter of FIG. 1. The well is filled with a liquid wire body encapsulation material.

In this and in the example of FIG. 2, the fill level of the encapsulant determines how close the encapsulant comes to the probe card substrate 112. In the illustrated examples the top surface of the probe card substrate, the surface from which the probe test wires extend, rests against the top of the gasket. As a result, to cover the wire bodies as fully as possible, the encapsulant material should come as close as possible to the top of the gasket. The well should be completely filled as shown in FIGS. 2 and 9. A variety of different mechanical structures may be used instead of simply resting the surface of the card substrate against the gasket. The depth of the liquid and the position of the card may be controlled by tabs, ridges, brackets, or internal registrations.

Figure 10:
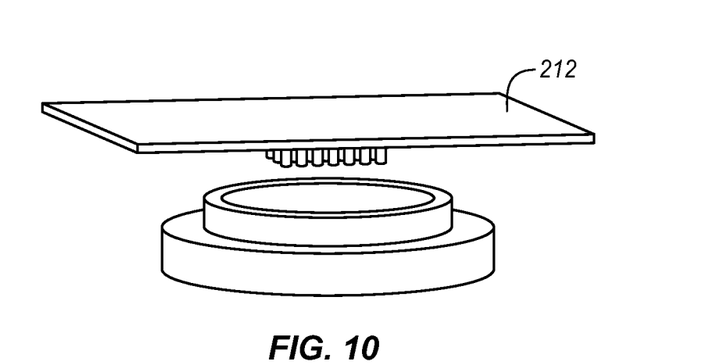
FIG. 10 is a diagram of the alternative platter and well with a probe card according to an embodiment.
Figure 11:
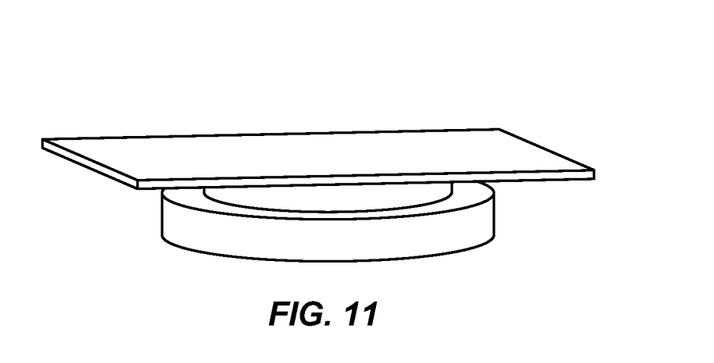
FIG. 11 is a diagram of the alternative platter and well with the probe card immersed in an encapsulation material according to an embodiment.
Figure 12:
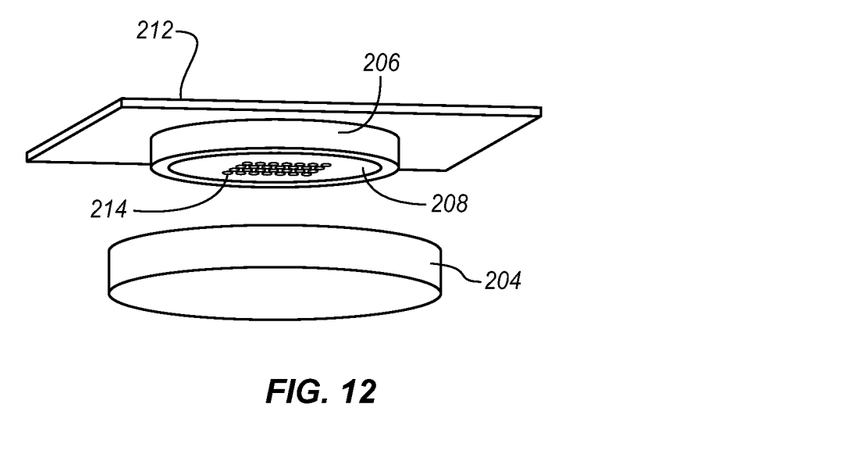
FIG. 12 is a diagram of the alternative platter with the probe card lifted off the platter according to an embodiment.

FIG. 10 is an isometric view of the probe card array in position over the well of liquid encapsulant. In FIG. 11, the wire array has been plunged into the encapsulation material and all the tips are datumed to the hard flat surface, i.e., the tips are resting against the platter 204. The encapsulation material makes its phase change from a liquid to a solid and as shown in FIG. 12, the probe card is pulled off of the hard flat surface. The hardened encapsulant is removed with the probe wires. In this example, the gasket is also attached to the hardened encapsulant. In some embodiments, by using different materials or by pre-treating the gasket, the gasket will not adhere to the encapsulant.

Figure 13:
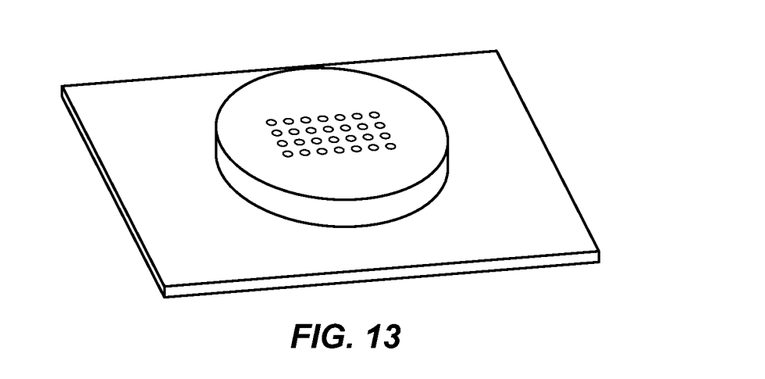
FIG. 13 is a diagram of the probe card of FIG. 12 inverted to show the probe wires according to an embodiment.
Figure 14:
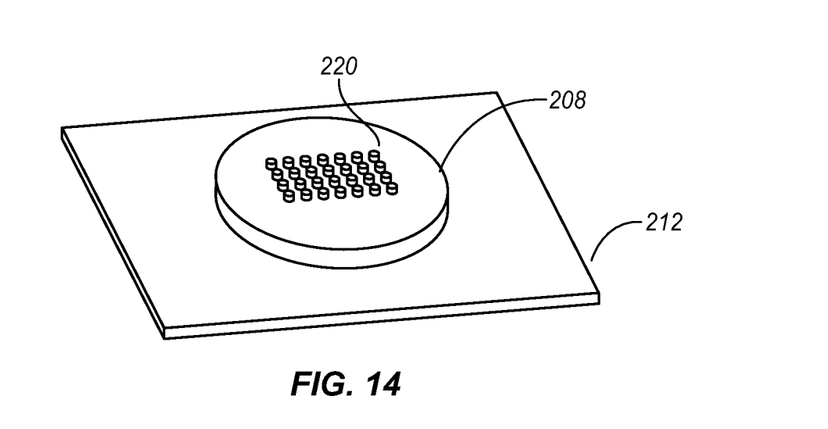
FIG. 14 is a diagram of the probe card of FIG. 13 with the probe wire ends exposed according to an embodiment.

FIG. 13 shows the probe card with the probe wires extending upwards in an isometric view. The gasket 206 has been removed. The tips of the wires 114 are approximately level with the surface of the encapsulation material. FIG. 14 is a similar view showing the probe card and the encapsulant after the probe wire tips have been exposed. A plasma may be used to etch away the encapsulation material to a desired wire etch depth. The exposed tips of the wires in the array are now cleaned by the etch process and free of any contamination.

The condition of the probe card of FIG. 14 is similar to that of FIG. 5. As a result, the same chemical etch and cleaning operations described in the context of FIGS. 6, 7, and 8 may be performed to obtain a similar result. The final probe card result resembles that of FIG. 7 in which the probe test wires are unharmed other than that the ends of the wires are etched to remove unwanted layers from the tip of the composite wires.

Figure 15:
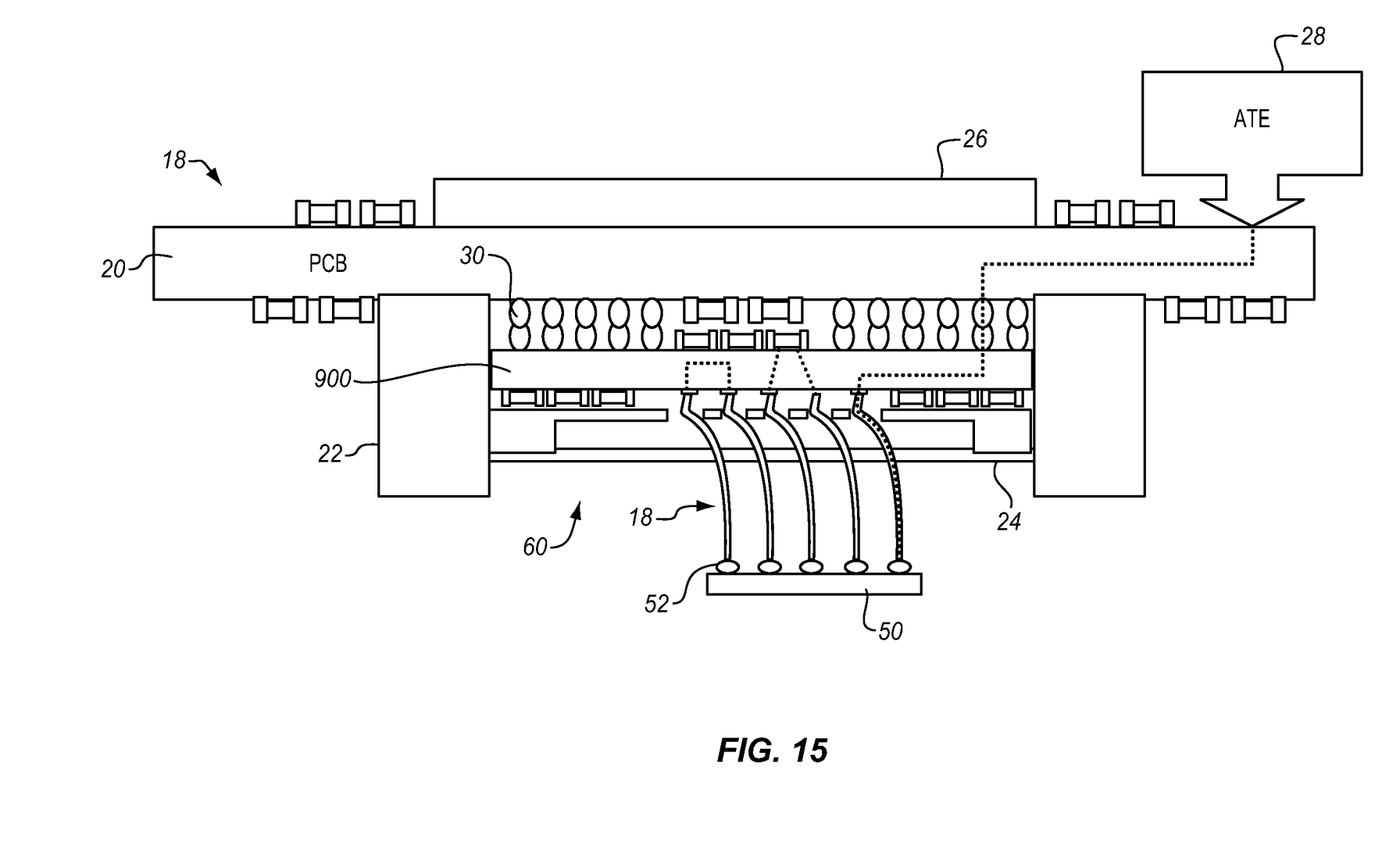
FIG. 15 is a side cross-sectional diagram of testing equipment using a probe head formed according to an embodiment.

FIG. 15 is an example of testing equipment capable of using the etched test probes 18 in a testing probe head 60 to test and sort dies or wafers 50 of various types. The test probes are arranged in a pattern to match with test sites on the device under test 50, such as a die. The wire test probes 18 each have a lower end configured and arranged for mating with a corresponding test pad 52 on the device 50 under test (DUT). The test probes 18 have a pitch that matches the pitch of the test pads 52 on the DUT 50.

A probe test head 60 carries the substrate and the test probes on a testing PCB (Printed Circuit Board) 20, which is strengthened by stiffening hardware 26. A mounting ring 22 holds the testing probe head 60 supported by the mounting ring to the PCB. A bottom side holder 24, attached to the mounting ring, secures the substrate 900 within the test head. The probe test head substrate 900, may be a multi-layered organic (MLO) or multi-layered ceramic (MLC) interconnect substrate and has a connection side 30 opposite the test probes. This connection side is formed using pads that are created when the substrate is originally manufactured. In the illustrated example, the connections are in a BGA (Ball Grid Array) for mating with corresponding contacts on the PCB 20. The PCB then connects to ATE (Automated Test Equipment) 28 which drives the test and measures the results through the test probes.

The example of FIG. 15 is a generalized diagram of test equipment to show a context for use of the test probes produced as described above. The test probes may be used in many other types of test equipment, depending on the nature of the DUT and the type of test to be performed. The test probes may also be used to test dies that are packaged or dies that are packaged together with other dies.

It is to be appreciated that a lesser or more equipped encapsulant well, etching process, plasma system, wire, or probe head, may be preferred for certain implementations. Therefore, the configuration of the exemplary systems and components may vary from implementation to implementation depending upon numerous factors, such as price constraints, performance requirements, technological improvements, or other circumstances.

Embodiments may be adapted to be used with a variety of different probe wires, probe heads, and devices under test using various types of testing equipment for different implementations. References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the following description and claims, the term "coupled" or "attached" along with its derivatives, may be used. These are used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, the specific location of elements as shown and described herein may be changed and are not limited to what is shown. Moreover, the actions of any process flow need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to a method of preparing tips of wires of a test probe head for use as test probes, the test probe head having a plurality of resilient wires. Some embodiments pertain to a method that includes covering wires of a probe head with an encapsulation material, the wires being attached to a test probe head substrate, each of the wires having two ends, the first end being attached to the substrate and the second end being opposite the substrate, each wire having an outer coating around a core, etching the wires to remove the outer coating at the second end of the wires, and removing the encapsulation material.

In further embodiments covering the wires comprises not covering the ends of the wires.

Further embodiments include applying an etch plasma to clean the second ends of the wires.

In further embodiments covering comprises covering also the second ends of the wires, the method further comprising etching the encapsulant from the second ends of the wires.

In further embodiments etching comprises applying an etch plasma to the encapsulated wires and the substrate.

Further embodiments include immersing the wires in a chemical etch bath after the plasma etch.

Further embodiments include applying a plasma clean to tips of the wire second ends.

In further embodiments covering comprises immersing the wires in the encapsulation material.

In further embodiments immersing the wires in the encapsulation material comprises immersing the wires in a well formed by a gasket over a flat surface and filled with the encapsulation material the gasket having a bottom that is open to the flat surface and a top that is open to the wires.

In further embodiments immersing the wires in the encapsulation material comprises immersing the wires in a well with a viscoelastic bottom surface so that the wire second ends are pushed into the viscoelastic bottom surface to remove the encapsulation material from tips of the wire second ends.

In further embodiments etching comprises immersing the wires in a chemical etch bath.

In further embodiments the outer coating is a conductive metal coating over a conductive core of the wire, the etching to remove a portion of the conductive metal coating to expose the conductive core.

Further embodiments include the wires having a prepared point at the second ends of the wires, wherein etching the wires comprises etching to expose the prepared point of the core of the wires.

Some embodiments pertain to a test probe head that includes a substrate, and a plurality of wires attached to the substrate, each of the wires having two ends, the first end being attached to the substrate and the second end being opposite the substrate, each wire having an outer coating around a core, the wires having been covered with an encapsulation material, etched to remove the outer coating at the second end of the wires, and the encapsulation material having been removed.

In further embodiments the wires were covered by immersion in the encapsulation material and hardening the encapsulation material to cover the wires.

In further embodiments the wires were immersed in the encapsulation material by immersing the wires in a well with a viscoelastic bottom surface so that the wire second ends are pushed into the viscoelastic bottom surface to remove the encapsulation material from tips of the wire second ends before the encapsulation material was hardened.

In further embodiments the etching was by immersing the wires in a chemical etch bath.

Some embodiments pertain to a microelectronic test system using a test probe head that includes automated test electronics to drive a test and measure results, a printed circuit board coupled to the automated test electronics, a substrate coupled to the printed circuit board, and a plurality of wires attached to the substrate, each of the wires having two ends, the first end being attached to the substrate and the second end being opposite the substrate, each wire having an outer coating around a core, the wires having been covered with an encapsulation material, etched to remove the outer coating at the second end of the wires, and the encapsulation material having been removed.

In further embodiments the outer coating is a conductive metal coating over a conductive core of the wire, the etching to remove a portion of the conductive metal coating to expose the conductive core.

Further embodiments include the wires having a prepared point at the second ends of the wires, wherein the etching exposes the prepared point of the core of the wires.

What is claimed is:

1. A method comprising:
   covering wires of a probe head with an encapsulation material, the wires being attached to a test probe head substrate, each of the wires having two ends, the first end being attached to the substrate and the second end being opposite the substrate, each wire having an outer coating around a core;
   plasma etching to remove the encapsulation material from the second ends of the wires;
   subsequent to the plasma etching, etching the wires to remove the outer coating at the second ends of the wires; and
   removing the encapsulation material.

2. The method of claim 1, wherein covering the wires comprises not covering the ends of the wires.

3. The method of claim 2, further comprising applying an etch plasma to clean the second ends of the wires.

4. The method of claim 1, further comprising immersing the wires in a chemical etch bath after the plasma etch.

5. The method of claim 1, wherein covering comprises immersing the wires in the encapsulation material.

6. The method of claim 5, wherein immersing the wires in the encapsulation material comprises immersing the wires in a well formed by a gasket over a flat surface and filled with the encapsulation material the gasket having a bottom that is open to the flat surface and a top that is open to the wires.

7. The method of claim 5, wherein immersing the wires in the encapsulation material comprises immersing the wires in a well with a viscoelastic bottom surface so that the wire second ends are pushed into the viscoelastic bottom surface to remove the encapsulation material from tips of the wire second ends.

8. The method of claim 1, wherein etching comprises immersing the wires in a chemical etch bath.

9. The method of claim 1, wherein the outer coating is a conductive metal coating over a conductive core of the wire, the etching to remove a portion of the conductive metal coating to expose the conductive core.

10. The method of claim 1, the wires having a prepared point at the second ends of the wires, wherein etching the wires comprises etching to expose the prepared point of the core of the wires.

11. A test probe head comprising:
    a substrate; and
    a plurality of wires attached to the substrate, each of the wires having two ends, the first end being attached to the substrate and the second end being opposite the substrate, each wire having an outer coating around a core, the wires having been covered with an encapsulation material, etched to remove the outer coating at the second end of the wires, and the encapsulation material having been removed, wherein the wires were covered by immersion in the encapsulation material and hardening the encapsulation material to cover the wires, wherein the wires were immersed in the encapsulation material by immersing the wires in a well with a viscoelastic bottom surface so that the wire second ends are pushed into the viscoelastic bottom surface to remove the encapsulation material from tips of the wire second ends before the encapsulation material was hardened.

12. The test probe head of claim 11, wherein the etching was by immersing the wires in a chemical etch bath.

13. A microelectronic test system using a test probe head comprising:
    automated test electronics to drive a test and measure results; a printed circuit board coupled to the automated test electronics; a substrate coupled to the printed circuit board; and
    a plurality of wires attached to the substrate, each of the wires having two ends, the first end being attached to the substrate and the second end being opposite the substrate, each wire having an outer coating around a core, the wires having been covered with an encapsulation material, plasma etched to remove the encapsulation material from the second ends of the wires, etched to remove the outer coating at the second end of the wires subsequent to plasma etching to remove the encapsulation material from the second ends of the wires, and the encapsulation material having been removed.

14. The system of claim 13, wherein the outer coating is a conductive metal coating over a conductive core of the wire, the etching to remove a portion of the conductive metal coating to expose the conductive core.

15. The system of claim 13, the wires having a prepared point at the second ends of the wires, wherein the etching exposes the prepared point of the core of the wires.

16. A method comprising:
    covering wires of a probe head with an encapsulation material, the wires being attached to a test probe head substrate, each of the wires having two ends, the first end being attached to the substrate and the second end being opposite the substrate, each wire having an outer coating around a core, wherein covering comprises immersing the wires in the encapsulation material, wherein immersing the wires in the encapsulation material comprises immersing the wires in a well with a viscoelastic bottom surface so that the wire second ends are pushed into the viscoelastic bottom surface to remove the encapsulation material from tips of the wire second ends;
    etching the wires to remove the outer coating at the second end of the wires; and
    removing the encapsulation material.

17. The method of claim 16, further comprising applying an etch plasma to clean the second ends of the wires.

18. The method of claim 17, further comprising immersing the wires in a chemical etch bath after the plasma etch.

19. The method of claim 16, wherein etching comprises immersing the wires in a chemical etch bath.

20. The method of claim 16, wherein the outer coating is a conductive metal coating over a conductive core of the wire, the etching to remove a portion of the conductive metal coating to expose the conductive core.

21. The method of claim 16, the wires having a prepared point at the second ends of the wires, wherein etching the wires comprises etching to expose the prepared point of the core of the wires.

\* \* \* \* \*